(12) United States Patent
Greene

(10) Patent No.: US 7,304,393 B1
(45) Date of Patent: Dec. 4, 2007

(54) SYSTEM AND METHOD FOR COUPLING INTERNAL CIRCUITRY OF AN INTEGRATED CIRCUIT TO THE INTEGRATED CIRCUIT'S PACKAGE PINS

(75) Inventor: Robert A. Greene, Plano, TX (US)

(73) Assignee: Microtune (Texas), L.P., Plano, TX (US)

( * ) Notice: Subject to any disclaimer, the term of this patent is extended or adjusted under 35 U.S.C. 154(b) by 228 days.

(21) Appl. No.: 10/807,789

(22) Filed: Mar. 24, 2004

(51) Int. Cl.
*H01L 23/52* (2006.01)

(52) U.S. Cl. .................. 257/784; 257/678; 438/106
(58) Field of Classification Search .............. 257/678, 257/784; 438/106
See application file for complete search history.

(56) References Cited

U.S. PATENT DOCUMENTS

| | | | |
|---|---|---|---|
| 5,165,590 A * | 11/1992 | Cini et al. ............... | 228/175 |
| 5,444,311 A | 8/1995 | Imai et al. | |
| 5,459,420 A | 10/1995 | Imai et al. | |
| 5,532,739 A | 7/1996 | Garakani et al. | |
| 5,640,199 A | 6/1997 | Garakani et al. | |
| 5,909,034 A * | 6/1999 | Soldavini et al. ........ | 257/48 |
| 6,188,287 B1 | 2/2001 | Avanic et al. | |
| 6,624,999 B1 | 9/2003 | Johnson | |
| 2002/0149077 A1 | 10/2002 | Locher | |
| 2002/0163396 A1 | 11/2002 | Lim et al. | |
| 2005/0116013 A1 * | 6/2005 | Kwark et al. ........... | 228/180.5 |
| 2005/0212604 A1 * | 9/2005 | Cyr et al. ............... | 331/16 |

OTHER PUBLICATIONS

International Search Report and Written Opinion issued for PCT/US2005/010090 dated Oct. 6, 2005.
"VCO Tank Design for the MAX2310", Dallas Semiconductor Maxim [online], 19 pages Retrieved on Feb. 22, 2004 Retrieved from: http://www.maxim-ic.com/appnotes.cfm/appnote_number/336/In/en.

* cited by examiner

*Primary Examiner*—Long Pham
(74) *Attorney, Agent, or Firm*—Fulbright & Jaworski LLP

(57) ABSTRACT

A technique is provided for communicatively coupling internal circuitry (e.g., a resonant tank) of an integrated circuit ("IC") with pins of the IC's package in a manner that minimizes the inductance of such coupling. In certain embodiments, more than two bondwires are coupled to an electrically common interface, wherein the bondwires are used for carrying a signal of the internal circuitry of the IC. More particularly, in certain implementations the bondwires are used as inductors for the internal circuitry (e.g., a resonant tank) of the IC. In certain embodiments, a plurality of bondwires are coupled to a plurality of IC package pins, which are electrically coupled together. By carrying signals of opposite polarity on each of the bondwires, the inductance of such bondwires is minimized.

43 Claims, 7 Drawing Sheets

LEGEND
$f_{osc} = 2\text{GHz}$
$V_{PK} = 1\text{V}$
$C_T = 2.6\text{pF}$
$L_T = 1.2\text{nH}$
$I_{PK} = 66\text{mA}$

SYSTEM AND METHOD FOR COUPLING INTERNAL CIRCUITRY OF AN INTEGRATED CIRCUIT TO THE INTEGRATED CIRCUIT'S PACKAGE PINS

TECHNICAL FIELD

The present invention relates generally to packaging of integrated circuits (ICs), and more particularly to a system and method for coupling an IC's internal circuitry to one or more pins of the IC's package in a manner that minimizes the inductance of the coupling mechanisms (e.g., bondwires) used.

BACKGROUND OF THE INVENTION

Circuitry is commonly packaged as an integrated circuit ("IC" or "chip"). For instance, internal circuitry (e.g., semiconductor devices) of an IC are typically electrically connected to pins (or leads) of the IC package by a process known as wire bonding. Generally, the wire bonding operation involves bonding wires to electrically connect pads residing on a die (the internal circuitry) to a pin (or "lead") of the IC package (or "lead frame"). The wire(s) may be bonded via any of a number of means, such as ultrasonic bonding, heat bonding, conductive glue bonding, or other suitable means. Once the wire bonding process is complete, the internal circuitry and bondwires are typically packaged in ceramic or plastic to form an integrated circuit device. Thus, bondwires are typically used to couple internal circuitry of the IC to pins of the IC's package to, for example, interface with external components. For instance, the IC's package pins may be electrically coupled (e.g., soldered) to a printed circuit board, as is well-known in the art.

One type of circuitry that may be implemented within an IC is a resonant frequency circuit. As used herein, a resonant frequency circuit refers to any circuitry that resonates at some frequency. As one example of a resonant frequency circuit, a Voltage Controlled Oscillator ("VCO") may be implemented within an IC for generating a signal having a desired frequency (based on the supplied voltage to the VCO). In some implementations, a resonant tank circuit may also be included. In general, a resonant tank circuit is a parallel combination of inductance ("L") and capacitance ("C") that determine the frequency ("RF") for a VCO. This frequency is given by the equation:

$$f = \frac{1}{2\pi\sqrt{L \times C}}.$$

One or more VCOs may be implemented on an IC to, for example, form a tuner that is operable to tune its RF frequency to a desired frequency based on the parallel combination of L and C of a resonant tank circuit. Various other types of resonant frequency circuits that may be implemented in an IC include, without limitation, resonant filters, matching circuits, etc.

The resonant frequency circuit may be implemented internally within an IC package, and such internal circuit may be communicatively coupled to the IC package such that signals from the circuit may be output by a pin of the IC and/or input signals may be received at a pin of the IC and supplied to the circuit. That is, the circuitry (or "die") implementing the internal resonant frequency circuitry (such as a VCO and resonant tank) of an IC may have certain ones of its input/output signals communicatively coupled to the IC package, which may in turn have its pins coupled to other components. Traditionally, a communicative trace of the resonant frequency circuit is coupled to a pin of the IC package via the well-known wire-bonding technique mentioned above. That is, a bondwire is used for coupling a trace of the internal resonant frequency circuit to its corresponding pin of the IC package, and the pins of the IC package may in turn be coupled to external components/traces to enable signals to be communicated therebetween (e.g., to enable input signals to be received by the appropriate input pins of the IC, which may be supplied to its internal resonant frequency circuit over the corresponding bondwire, and to enable output signals generated by the internal resonant frequency circuit to be supplied to and output by the IC's corresponding output pins).

In general, it is desirable to reduce noise (e.g., phase noise, amplitude noise, etc.) in a resonant frequency circuit. In many instances, the electrical characteristics (e.g., resistance) imparted to a signal by the bondwire used for carrying such signal results in phase noise that must be accounted for (e.g., filtered, offset, etc.). In many instances, the bondwires that couple the IC package to the IC's internal circuitry (e.g., resonant frequency circuitry) are used to provide inductance to such internal circuitry. The amount of such inductance is traditionally dictated by the IC package dimensions (e.g., dictated by the length of and spacing between the bondwires required for coupling the IC package with its internal circuitry). Once these dimensions are known, a technique for minimizing noise of the internal circuitry may be determined (e.g., capacitance may be increased to reduce the inductance-to-capacitance ratio, which may minimize the resulting noise of an internal resonant frequency circuit).

For instance, when implementing a VCO with a resonant tank in the manner mentioned above, the Noise to Carrier Ratio (NCR) is defined as the thermal noise power of the tank divided by the signal power in the tank:

$$NCR = \frac{E_{thermal}}{E_{tank}} = \frac{k_B T}{CV_0^2},$$

where $k_B$ is known as the Boltzmann constant. Thus, as the capacitance across the tank is increased (assuming that the signal swing in the tank is constant), the noise relative to the carrier frequency is decreased. Assuming that the oscillator needs to operate at a specified frequency, the capacitance allowed for a given frequency is inversely related to the inductance of the tank, as shown by equations (1) and (2):

$$f_{osc} = \frac{1}{2\pi\sqrt{LC}} \quad (1)$$

Solving for the capacitance, C, $$C = \frac{1}{4\pi^2 L f_{osc}^2} \quad (2)$$

In general, more signal power reduces noise (e.g., phase noise in the above VCO). Thus, in the above VCO implementation, if the resonant tank inductance could be reduced, then the capacitance could be increased while still maintaining the same oscillation frequency. That is, for optimizing the phase noise of the VCO, it may be desirable to decrease the tank inductance and increase the capacitance in order to achieve a particular resonant frequency, while allowing more current to be supplied to the resonant tank.

As mentioned above, bondwires are traditionally used to produce the inductance of the resonant tank in such an implementation, and thus the chip and package dimensions dictate the inductance of the tank. That is, the capacitors, varactors, etc. of the VCO and resonant tank may be implemented on-chip (in circuitry internal to the IC package), and bondwires coupled from this internal circuitry to the IC package are used for supplying the inductance. This type of implementation limits how much inductance is supplied because it is fixed by the package dimensions and the dimensions of the die. So, this implementation provides limited flexibility. As mentioned above, the inductance is fixed (e.g., based on the package dimensions), and so the capacitance that is required in order to obtain the desired frequency is then set. Of course, that may not be the optimum ratio of inductance and capacitance.

Again, increased signal power reduces the phase noise of the oscillator. Thus, to improve phase noise more signal power may be supplied to the resonant tank by increasing the capacitance and decreasing the inductance for a given output frequency. That is, for a desired (fixed) output frequency range, the phase noise may be improved by improving the L to C ratio. More specifically, by reducing the inductance (L), the capacitance (C) can be increased, which improves the phase noise of the resonant frequency circuit (VCO in this example).

BRIEF SUMMARY OF THE INVENTION

The present invention is directed to a system and method for coupling internal circuitry of an integrated circuit (IC) with the IC's package. More specifically, certain embodiments are directed to coupling mechanisms (e.g., bondwires) that are used for providing inductance for internal circuitry, such as a resonant tank circuitry of an IC. As described further herein, coupling techniques are provided for reducing the amount of inductance provided by such coupling mechanisms.

In accordance with certain embodiments, a technique is provided for communicatively coupling internal circuitry, such as resonant frequency circuitry (e.g., a resonant tank), of an IC with pins of the IC's package in a manner that minimizes the inductance of such coupling. In certain embodiments, more than two bondwires are coupled to an electrically common interface (e.g., one IC package pin or a plurality of IC package pins that are electrically coupled together), wherein the bondwires are used for carrying a signal of the internal circuitry of the IC. More particularly, in certain implementations the bondwires are used as inductors for the internal circuitry (e.g., resonant tank circuitry) of the IC. The bondwires carry signals of different polarities. For instance, as one example implementation, three bondwires may be used for coupling the internal circuitry to an electrically common interface, wherein two of the three bondwires carry a signal of a first polarity and the third bondwire carries a signal of an opposite polarity. As another example, four bondwires may be used for coupling the internal circuitry to an electrically common interface, wherein two of the bondwires carry a signal of a first polarity and two of the bondwires carry a signal of an opposite polarity. Based on the relative arrangement of the bondwires, the mutual inductance between the such bondwires may effectively reduce the inductance. For example, the bondwires may be arranged to interleave the signal polarities carried thereby such that the inductance of each of the plurality of bondwires will essentially cancel each other to some extent (or counteract each other), thereby reducing the inductance of the internal circuit.

In certain embodiments, this coupling technique is distributed across a plurality of IC package pins that are electrically coupled together. For instance, two bondwires may be coupled from the internal circuitry to a first IC package pin, and two bondwires may be coupled from the internal circuitry to a second IC package pin. The two bondwires coupled to each IC package pin may carry signals of opposite polarity. That is, the two bondwires coupled to the first IC package pin may each carry signals of opposite polarity, and the two bondwires coupled to the second IC package pin may each carry signals of opposite polarity. Further, the two IC package pins may be arranged side-by-side (i.e., may be "neighbor" pins of the IC package), and the bondwires may be arranged to interleave the signal polarity carried thereby across both of the pins. Thus, neighboring ones of the four bondwires may carry signals of opposite polarities such that the inductance across all four of the bondwires is minimized. The two pins may be electrically coupled together within the IC's package or external to such package (e.g., the pins may be electrically coupled together by traces on a printed circuit board to which the IC is coupled), as examples.

Embodiments of the present invention are particularly applicable for circuitry that uses the coupling mechanisms (e.g., bondwires) as inductors in a resonant tank, such as is commonly used in filters or oscillators. Ideally, in such implementations, there should be no signal transmitted off of the IC through the bondwires that are used as inductors. As described further herein, the coupling technique of embodiments of the present invention enable the effective inductance of such bondwires to be reduced, thereby allowing for a reduction in noise (e.g., phase noise of an oscillator) to be achieved. That is, the coupling technique of embodiments of the present invention enable reduction in inductance provided to the tank circuitry, which allows the capacitance to be increased such that increased power is supplied to the tank, which improves the noise of the IC's internal resonant frequency circuit (e.g., oscillator, filter, etc.). More particularly, the embodiments described herein provide various coupling techniques that allow greater flexibility in controlling the L to C ratio within an IC that uses bondwires as inductors. Rather than the L to C ratio being fixed based on the IC's dimensions, greater flexibility in controlling the L (and thus the L to C ratio) is provided. As an example, for an IC of given dimensions, coupling bondwires across a plurality of pins that are electrically coupled together with the bondwires arranged to interleave opposing polarities of signals carried thereby provides the ability to further reduce the inductance of such bondwires beyond that of traditional coupling techniques for the IC of such given dimensions.

According to at least one embodiment, an IC is provided that comprises internal circuitry, and a package having at least two pins. The IC further comprises a first carrier communicatively coupling the internal circuitry with a first one of the at least two pins, wherein the first carrier carries a signal of a first polarity; and a second carrier communicatively coupling the internal circuitry with the first one of the at least two pins, wherein the second carrier carries a signal of a polarity opposite the first polarity. The IC further comprises a third carrier communicatively coupling the internal circuitry with a second one of the at least two pins, wherein the third carrier carries a signal of the first polarity; and a fourth carrier communicatively coupling the internal circuitry with the second one of the at least two pins, wherein the fourth carrier carries a signal of a polarity opposite the first polarity. As described further herein, the carriers may be bondwires, as examples. Also, in certain embodiments, the internal circuitry comprises resonant frequency circuitry. In some implementations such resonant frequency circuitry uses the carriers as inductors. For instance, in certain implementations, the resonant frequency circuitry comprises a resonant tank circuit that uses the carriers as inductors. Further, in certain embodiments, the pins are electrically coupled together.

According to at least one embodiment, a method is provided that comprises coupling a first carrier from an internal resonant frequency circuitry of an integrated circuit to an electrically common interface of the integrated circuit's package, wherein the first carrier is arranged to carry signals of a first polarity. The method further comprises coupling a second carrier from the internal resonant frequency circuitry of the integrated circuit to the electrically common interface of the integrated circuit's package, wherein the second carrier is arranged to carry signals of a polarity opposite the first polarity. The method further comprises coupling a third carrier from the internal resonant frequency circuitry of the integrated circuit to the electrically common interface of the integrated circuit's package, wherein the third carrier is arranged to carry signals of the first polarity. Again, in certain embodiments, the carriers may be bondwires, and in certain embodiments, the resonant frequency circuitry of the IC comprises a resonant tank circuit that uses the carriers as inductors. Also, in certain embodiments, the electrically common interface comprises a plurality of pins of the IC that are electrically coupled together.

According to at least one embodiment, a system comprises resonant tank circuitry implemented in a package that provides a plurality of interface means that are electrically coupled together. For example, such plurality of interface means may be a plurality of pins of an IC package. The system further comprises a first coupling means (e.g., a first bondwire) for communicatively coupling the resonant tank circuitry to one of the plurality of interface means, wherein the first coupling means carries a signal of a first polarity. And, the system comprises a second coupling means (e.g., a second bondwire) for communicatively coupling the resonant tank circuitry to one of the plurality of interface means, wherein the second coupling means carries a signal of polarity opposite the first polarity. In certain embodiments, the first and second coupling means (e.g., bondwires) are used as inductors for the resonant tank circuitry.

According to at least one embodiment, a system comprises internal circuitry implemented in a package that provides a plurality of pins. The system further comprises a first plurality of carriers communicatively coupling the internal circuitry to a first one of the plurality of pins. The first plurality of carriers are used as inductors for the internal circuitry, and at least one of the first plurality of carriers carries a signal of a first polarity (e.g., positive polarity) and at least one other of the first plurality of carriers carries a signal of polarity opposite the first polarity (e.g., negative polarity). The system further comprises a second plurality of carriers communicatively coupling the internal circuitry to a neighboring pin of the first pin. The second plurality of carriers are used as inductors for the internal circuitry, and at least one of the second plurality of carriers carries a signal of the first polarity and at least one other of the second plurality of carriers carries a signal of polarity opposite the first polarity. The first and second plurality of carriers are arranged to interleave the polarities of signals carried thereby. In certain embodiments, the internal circuitry comprises resonant tank circuitry, for example. In certain embodiments, the first and neighboring pins are electrically coupled together.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
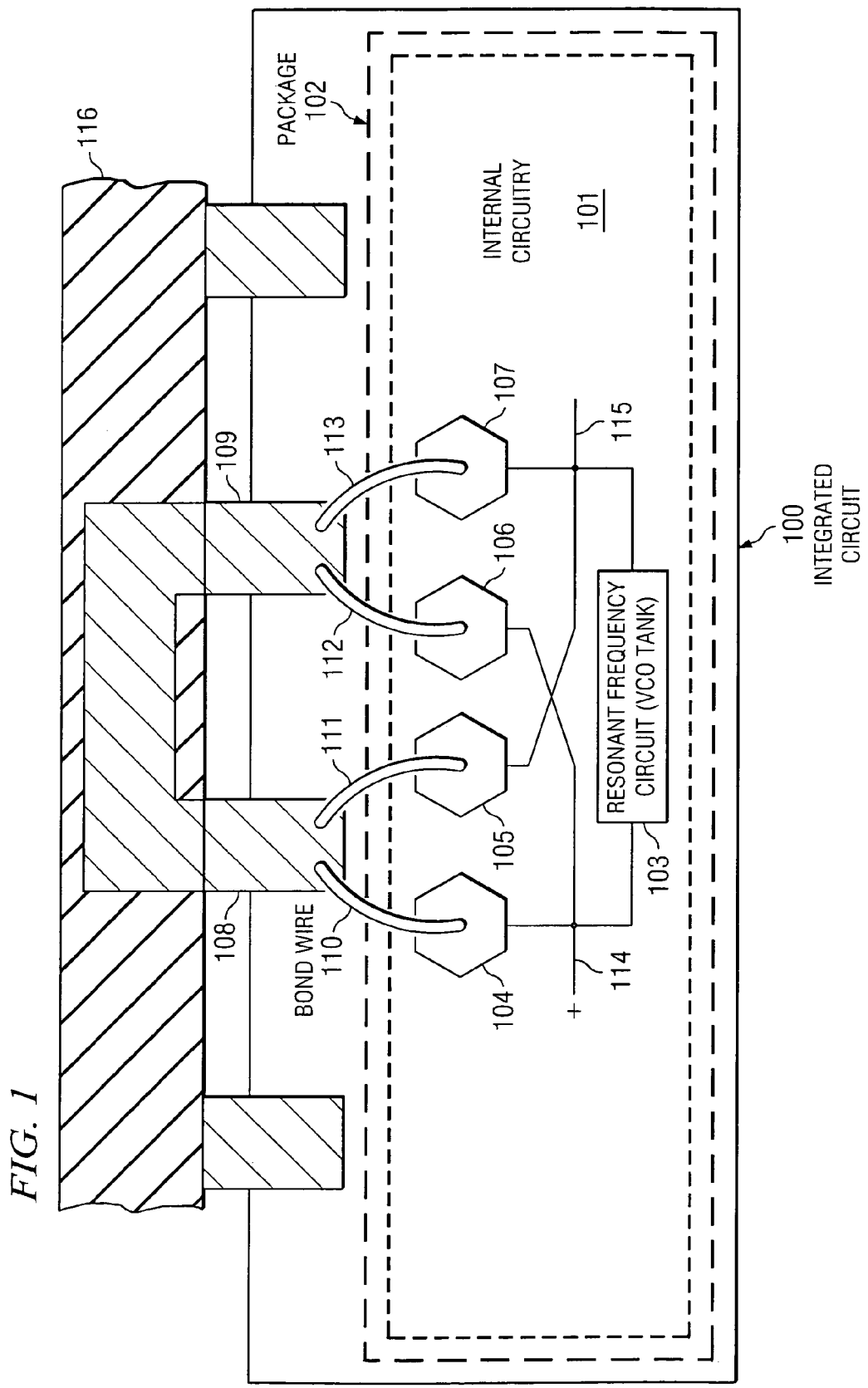
FIG. 1 shows an example implementation of coupling internal circuitry of an IC to the IC's package pins according to one embodiment.

In accordance with certain embodiments, a technique is provided for communicatively coupling internal circuitry of an IC with pins of the IC's package in a manner that minimizes the inductance of such coupling. As described further below, in certain embodiments more than two bondwires are coupled to an electrically common interface (e.g., one IC package pin or a plurality of IC package pins that are electrically coupled together), wherein the bondwires are used for carrying a signal of the internal circuitry of the IC. The bondwires carry signals of different polarities. For instance, as one example implementation, three bondwires may be used for coupling the internal circuitry to an electrically common interface, wherein two of the three bondwires carry a signal of a first polarity and the third bondwire carries a signal of an opposite polarity. As another example, four bondwires may be used for coupling the internal circuitry to an electrically common interface, wherein two of the bondwires carry a signal of a first polarity and two of the bondwires carry a signal of an opposite polarity. Based on the relative arrangement of the bondwires, the mutual inductance between the such bondwires may effectively reduce the inductance. For example, the bondwires may be arranged to interleave the signal polarities carried thereby such that the inductance of each of the plurality of bondwires will essentially cancel each other to some extent (or counteract each other), thereby reducing the inductance of the internal circuit.

In certain embodiments, this coupling technique is distributed across a plurality of IC package pins that are electrically coupled together. For instance, two bondwires may be coupled from the internal circuitry to a first IC package pin, and two bondwires may be coupled from the internal circuitry to a second IC package pin. The two bondwires coupled to each IC package pin may carry signals of opposite polarity. That is, the two bondwires coupled to the first IC package pin may each carry signals of opposite polarity, and the two bondwires coupled to the second IC package pin may each carry signals of opposite polarity. Further, the two IC package pins may be arranged side-by-side (i.e., may be "neighbor" pins of the IC package), and the bondwires may be arranged to interleave the signal polarity carried thereby across both of the pins. Thus, neighboring ones of the four bondwires may carry signals of opposite polarities such that the inductance across all four of the bondwires is minimized. The two pins may be electrically coupled together within the IC's package or external to such package (e.g., the pins may be electrically coupled together by traces on a printed circuit board to which the IC is coupled), as examples.

In certain embodiments the bondwires are used as inductors for the internal circuitry of the IC. Embodiments provided herein provide an arrangement of such bondwires that minimizes the inductance. Embodiments of the present invention are particularly applicable for ICs having internal circuitry that comprise resonant frequency circuitry. As mentioned above, a resonant frequency circuitry refers to any circuitry that resonates at some frequency. Examples of resonant frequency circuits include, without limitation, oscillators (e.g., voltage-controlled oscillators, differential oscillators, etc.), resonant tanks (e.g., differential resonant tank), resonant filters, matching circuits, etc.

FIG. 1 shows an example implementation according to one embodiment for communicatively coupling an IC's internal circuitry to the IC's package pins. As shown, an IC 100 includes an internal circuitry portion 101 (e.g., a die) and a package portion 102. In this example, internal circuitry portion 101 includes resonant frequency circuit 103, such as a VCO and tank, etc. Package 102 includes pins, such as pins 108 and 109, that may be used for coupling the IC to an external component, such as to a printed circuit board (PCB) 116 in the example of FIG. 1. That is, pins 108 and 109 provide an interface for communicatively coupling IC 100 to external components, as is well-known. As shown, pins 108 and 109 are electrically coupled together (on board 116).

Thus, pins 108 and 109 provide an electrically common interface. While pins 108 and 109 are electrically coupled on board 116 in this example, in other implementations they may be electrically coupled together within package 102.

As described further below, in the example of FIG. 1, two bondwires are coupled to each of pins 108 and 109, wherein the two bondwires coupled to each pin provide opposite polarities. That is, the two bondwires coupled to pin 108 each carry signals of opposite polarities, and the two bondwires coupled to pin 109 each carry signals of opposite polarities. Further, the bondwires are arranged in an interleaved manner to alternate the signal polarities (i.e., positive-negative-positive-negative) across both of pins 108 and 109. This arrangement maximizes the negative mutual inductance terms resulting in a significantly lower tank inductance.

The example of FIG. 1 shows an implementation suitable for a differential oscillator being implemented in resonant frequency circuit 103. With such a differential oscillator, two inductors are provided. Running two bondwires per inductor translates into running a total of four bondwires to establish the resonant tank. Unfortunately, most IC packages do not tolerate more than two bondwires to the same package pin. Thus, in order to run double bondwires for a differential tank, two IC package pins, pins 108 and 109, are used in this example. Of course, for certain other types of resonant frequency circuits a different number of IC package pins may be used. For instance, in certain implementations, a single IC package pin, such as pin 108, may be used for coupling with the internal resonant frequency circuit 103 of the IC, and a plurality of bondwires (e.g., bondwires 110-113) carrying signals of different polarities may be used for this coupling. For example, if an IC package tolerates more than two bondwires to be coupled to a given pin, then three or more bondwires may be coupled to such pin, which may reduce the overall number of pins utilized. In certain other implementations, such as the example described below in connection with FIG. 2, more than two IC package pins may be used for coupling with the internal resonant frequency circuit 103 of the IC.

With respect to the example of FIG. 1, how the two package pins 108 and 109 and four bondwires 110-113 are configured can vary a great deal. If one polarity of the differential tank of resonant frequency circuit 103 is bonded to one pin (e.g., pin 108) and the other polarity bonded to the second pin (e.g., pin 109), then the inductance of the pin itself is added to the two parallel bondwires. Unfortunately, the mutual inductance between the two parallel bondwires will make the effective inductance be higher than the parallel combination of the two self-inductances. If, however, both polarities of the differential tank of resonant frequency circuit 103 are bonded to each pin, the mutual inductance of the two bondwires makes the effective inductance of the bondwires smaller. Further, if the bondwires 110-113 are interleaved so as to alternate polarities across those bondwires (i.e., positive-negative-positive-negative), as in the example of FIG. 1, this maximizes the negative mutual inductance terms resulting in a significantly lower tank inductance.

In the example of FIG. 1, bondwires 110 and 111 couple internal pads 104 and 105, respectively, to pin 108, and bondwires 112 and 113 couple internal pads 106 and 107, respectively, to pin 109. A signal 114 of a first polarity (positive (+) polarity) of resonant frequency circuit 103 is supplied to internal pads 104 and 106, and a signal 115 of an opposite polarity (negative (−) polarity) of resonant frequency circuit 103 is supplied to internal pads 105 and 107.

Thus, regarding the two bondwires coupled to pin 108, bondwire 110 carries signal 114 of positive polarity, while bondwire 111 carries signal 115 of negative polarity. Similarly, regarding the two bondwires coupled to pin 109, bondwire 112 carries signal 114 of positive polarity, while bondwire 113 carries signal 115 of negative polarity. Again, by having opposite polarities of the differential tank bonded to each pin, the mutual inductance of the two bondwires reduces the effective inductance of the bondwires. Further, by interleaving the alternating polarities (i.e., positive-negative-positive-negative) across pins 108 and 109 in the example arrangement of FIG. 1, the negative mutual inductance terms are maximized, thus resulting in a significantly lower tank inductance. As a result of reducing the inductance (L), the L:C ratio is decreased, thus effectively increasing power to the resonant frequency circuit 103, which minimizes phase noise.

While various embodiments are described herein for coupling an IC's internal resonant frequency circuit (such as circuit 103 of FIG. 1) to the IC's package pins (such as pins 108 and 109 of FIG. 1), such embodiments are particularly applicable for circuitry that uses the coupling mechanisms (e.g., bondwires) as inductors in a resonant tank, such as is commonly used in filters or oscillators. That is, in preferred embodiments, resonant frequency circuit 103 includes a resonant tank that uses bondwires 110-113 as inductors. Ideally, in such implementations, there should be no signal transmitted off of the IC through the bondwires that are used as inductors (bondwires 110-113 in FIG. 1). As described further herein, the coupling technique of embodiments of the present invention enable the effective inductance of such bondwires to be reduced, thereby allowing for a reduction in noise to be achieved.

Figure 2:
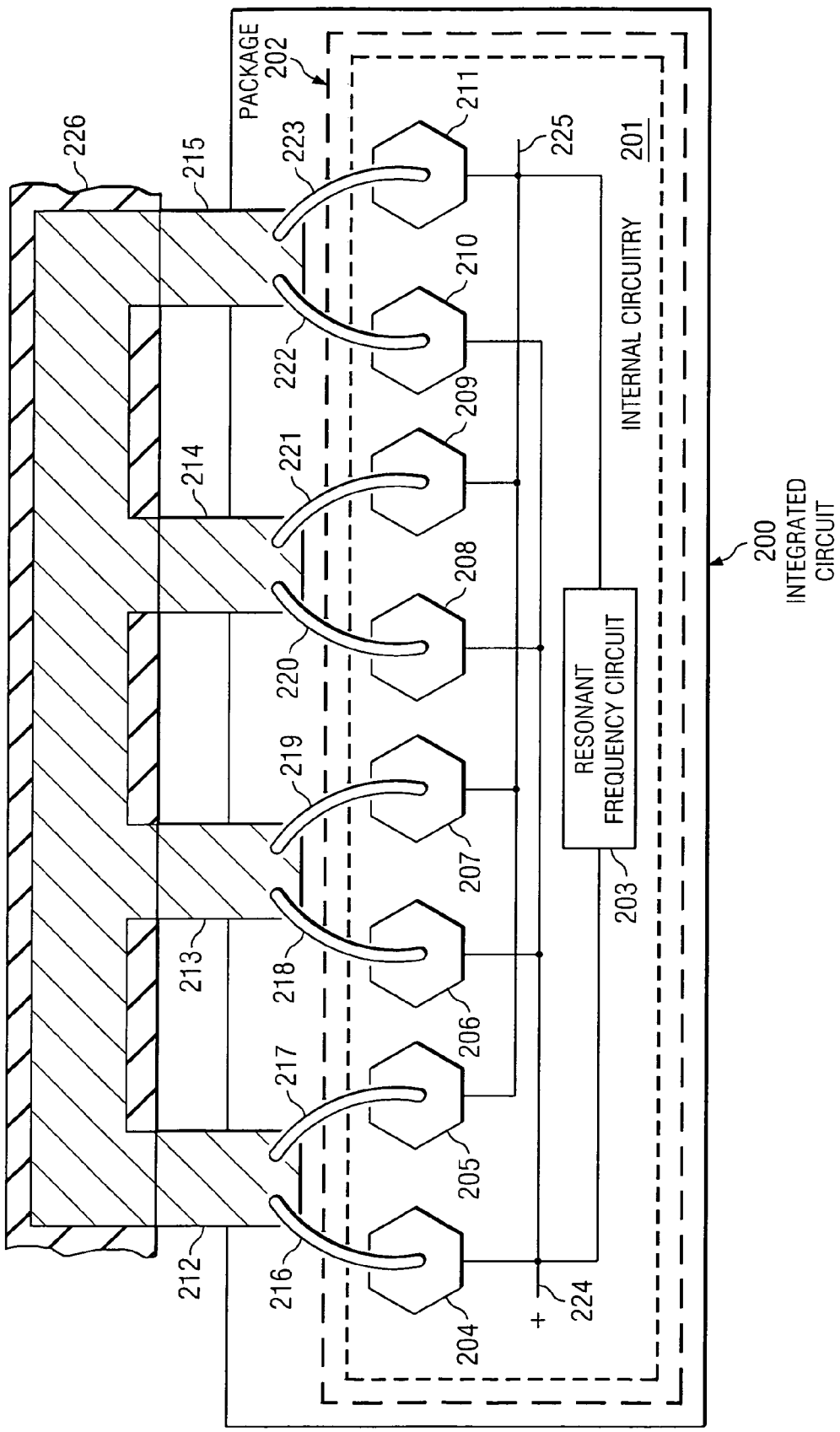
FIG. 2 shows an example implementation of coupling an IC's internal resonant frequency circuitry to the IC package pins according to one embodiment.

FIG. 2 shows an example implementation of coupling internal circuitry to the IC package pins according to one embodiment. In this example of FIG. 2, more than two IC package pins are used for coupling with the internal circuit of the IC. As with the example of FIG. 1, two bondwires are coupled to each of the IC package pins, and the bondwires coupled to each IC package pin carry signals of opposite polarities. Further, this example arranges the bondwires such that the polarity of the signals carried alternates with each bondwire, such that the neighboring bondwire(s) of any given bondwire carry signals of opposite polarity relative to the polarity of the signal carried by the given bondwire, as described further below.

In FIG. 2, IC 200 includes an internal circuitry portion 201 (e.g., a die) and a package portion 202. In this example, internal circuitry portion 201 includes resonant frequency circuit 203, such as a VCO and tank, etc. Package 202 includes pins, such as pins 212-215, that may be used for coupling the IC to an external component, such as to a printed circuit board (PCB) 226 in the example of FIG. 2. In this example, pins 212-215 are neighboring pins, arranged side-by-side in package 202, and pins 212-215 are all electrically coupled together (e.g., on board 226), as shown. Thus, pins 212-215 provide an electrically common interface. While pins 212-215 are coupled together externally (on board 226) in this example, they may be coupled internal to IC 200 (e.g., within package 202) in other implementations. As described further below, in this example, two bondwires are coupled to each of pins 212-215, wherein the two bondwires coupled to each pin provide opposite polarities. Further, the bondwires are arranged in parallel interleaving the polarities of signals carried thereby (i.e., positive-negative-positive-negative) across all of pins 212-215. This arrangement maximizes the negative mutual inductance terms resulting in a significantly lower tank inductance.

In the example of FIG. 2, bondwires 216 and 217 couple internal pads 204 and 205, respectively, to pin 212; bondwires 218 and 219 couple internal pads 206 and 207, respectively, to pin 213; bondwires 220 and 221 couple internal pads 208 and 209, respectively, to pin 214; and bondwires 222 and 223 couple internal pads 210 and 211, respectively, to pin 215. A signal 224 of a first polarity (positive (+) polarity) of resonant frequency circuit 203 is supplied to internal pads 204, 206, 208, and 210, and a signal 225 of an opposite polarity (negative (−) polarity) of resonant frequency circuit 203 is supplied to internal pads 205, 207, 209 and 211. Thus, regarding the two bondwires coupled to pin 212, bondwire 216 carries signal 224 of positive polarity, while bondwire 217 carries signal 225 of negative polarity. The two bondwires coupled to each of pins 213-215 similarly carry signals of opposite polarities. Again, by having opposite polarities of the differential tank bonded to each pin, the mutual inductance of the two bondwires reduces the effective inductance of the bondwires. Further, by interleaving the polarities (i.e., positive-negative-positive-negative) across pins 212-215 in the example arrangement of FIG. 2, the negative mutual inductance terms are maximized, thus resulting in a significantly lower tank inductance. As a result of reducing the inductance (L), the L:C ratio is decreased, thus effectively increasing power to the resonant frequency circuit 203, which minimizes phase noise.

Figure 3:
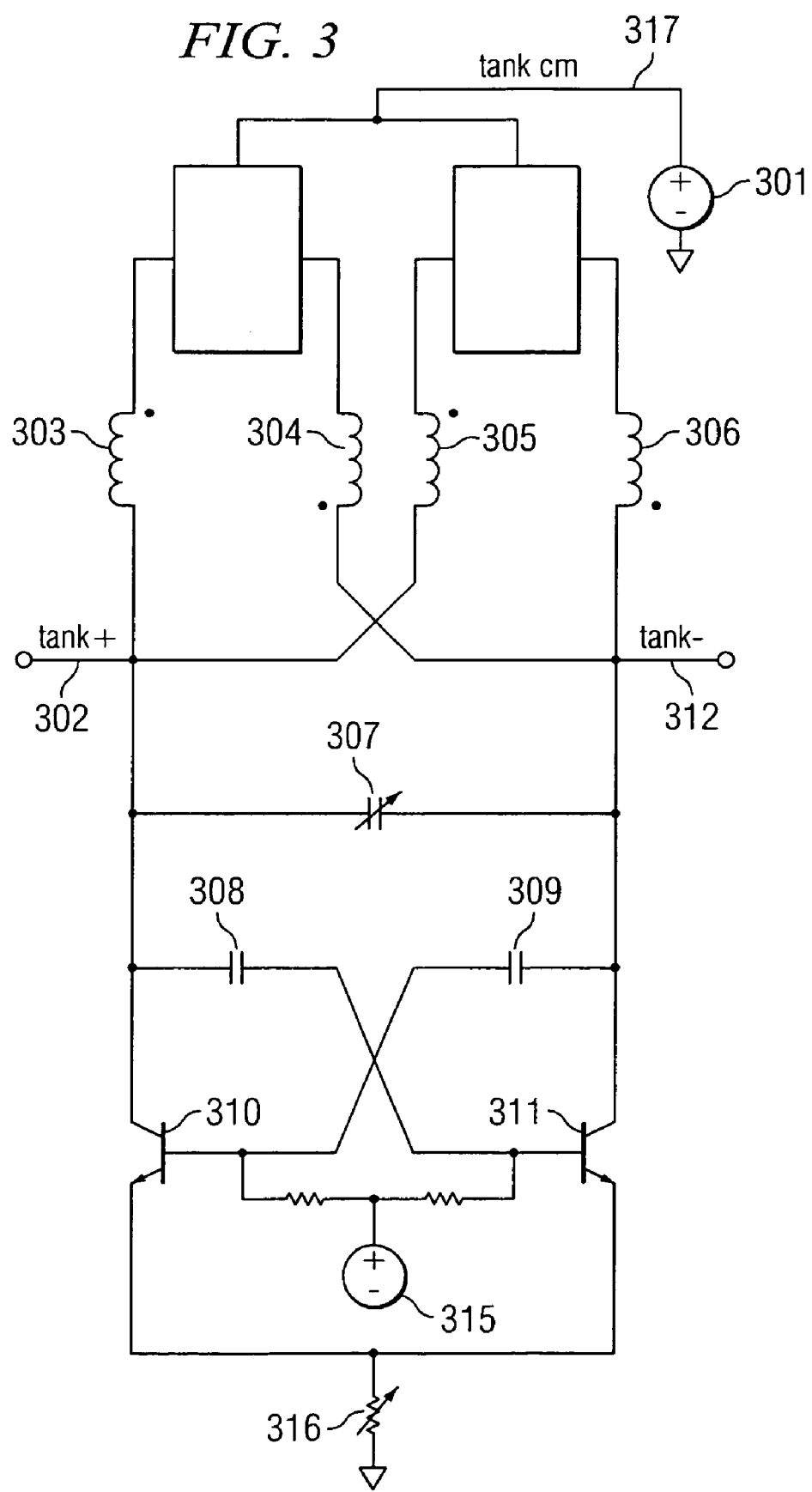
FIG. 3 shows an example circuit diagram that logically illustrates the operation of the example connection scheme of FIG. 1.

FIG. 3 shows an example circuit diagram that logically illustrates the operation of the example connection scheme of FIG. 1. That is, the example circuit diagram of FIG. 3 is provided to illustrate an example circuit equivalent of the bondwire connection scheme of FIG. 1 to further illuminate how the inductance of such bondwire connection is minimized. Power source 301 sets the common mode quiescent point tankcm signal 317 around which the differential signal (comprised of the difference in potential between signals tank+ signal 302 and tank− signal 312) oscillates. Power source 315 sets the quiescent point for biasing the bases of transistors 310 and 311. Inductors 303, 304, 305, and 306 correspond to bondwires 110, 111, 112, and 113 of FIG. 1, respectively.

In one state, all of the energy in the resonant tank is stored as charge across the capacitive elements of the resonant tank (i.e. capacitors 307, 308, and 309) with the voltage of tank+ signal 302 being larger than the voltage of tank− signal 312. In this state, current begins to flow through inductors 303, 304, 305 and 306. The current will peak (as all of the energy is now stored in the inductors) when the voltage across the capacitive elements of the resonant tank (capacitors 307, 308, and 309) is zero (meaning no net charge is stored on the capacitors). At this point, the magnitude of the current flowing in the inductive elements of the resonant tank (inductors 303, 304, 305, and 306) will begin to decrease, but the sign of the current will not change. While this energy is being transferred through the inductors (essentially from one side of the capacitor to the other), the signal current is flowing into the dot of inductors 304 and 306 and out of the dot of inductors 303 and 305. In this configuration, the sign of the induced voltage between inductors 303 and 304 caused by their mutual inductance would be negative (because the current is flowing into the dot in one inductor and out of the dot in the other inductor). Likewise, the sign of the induced voltage between inductor neighboring pairs 305/306, 304/305, and 303/306 caused by their mutual inductance would be negative. Contrarily, the induced voltage between inductor pairs 303/305 and 304/306 would be positive (since the current in both inductors of each pair flows either into or out of the dot). The magnitude, however, of the induced voltage is proportional to the mutual inductance between a pair of inductors which is the product of a coupling factor, k, that is between zero and unity and the geometric mean of the two inductors. Since the inductors in the resonant tank can generally be assumed to be approximately equal (the analysis is unchanged if they are not nearly equal, but the equations become more complex), the mutual inductance is simply a product of the coupling factor, k, and the value of one of the inductors. The coupling factor represents the amount of magnetic flux shared between the two inductors, and decreases with the distance between the inductors. Thus, the mutual inductance is greatest between the physically closest inductor pairs (e.g. 303/304, 304/305, and 305/306). Consequently, the negative mutual inductance terms are greater in magnitude and quantity than the positive mutual inductance terms, resulting in an effective negative mutual inductance. The mutual inductance, therefore, directly reduces the effective differential inductance (the sum of all of the mutual and self inductances) between tank+ signal 302 and tank− signal 312.

When all of the charge stored on capacitors 307, 308, and 309 has moved to the other side of the capacitor (e.g. from tank+ signal 302 to tank− signal 312 such that the voltage at tank− signal 312 is greater than the voltage at tank+ signal 302), the current reverses polarity and begins to transfer the charge back to the other side of the capacitors (tank+ signal 302). Again, the current peaks when the voltage across the capacitive elements is zero and then decreases until all of the charge is again stored on the capacitive elements at which point the circuit has returned to the initial state as described above (namely that all of the energy in the resonant tank is stored as charge across the capacitive elements and that the voltage of tank+ signal 302 is larger than the voltage of tank− signal 312). While the energy is being transferred through the inductors, the signal current is flowing out of the dot of inductors 304 and 306 and into the dot of inductors 303 and 305. In this configuration, the sign of the induced voltage between inductors 303 and 304 caused by their mutual inductance would be negative (because the current is flowing into the dot in one inductor and out of the dot in the other inductor). Likewise, the sign of the induced voltage between inductor pairs 305/306, 304/305, and 303/304 caused by their mutual inductance would be negative. Contrarily, the induced voltage between inductor pairs 303/305 and 304/306 would be positive (since the current in both inductors of each pair flows either into or out of the dot). The magnitude, as mentioned above, of the mutual inductance is greatest between the physically closest inductor pairs (e.g. 303/304, 304/305, and 305/306). Again, as above, the negative mutual inductance terms are greater in magnitude and quantity than the positive mutual inductance terms, resulting in an effective negative mutual inductance. The mutual inductance, therefore, directly reduces the effective differential inductance (the sum of all of the mutual and self inductances) between tank+ signal 302 and tank− signal 312.

Transistors 310 and 311 supply current to overcome the resistive losses in the resonant tank (comprised of inductors 303, 304, 305, and 306 and capacitors 307, 308, and 309). The amplitude of the oscillation is controlled by the voltage source 315 and the variable resistor 316 which limit the maximum amount of current that the transistors can supply to the resonant tank. Capacitors 308 and 309, in addition to comprising a part of the resonant tank, isolate the bases of transistors 310 and 311 from the output thus allowing more flexibility in the quiescent bias and reducing sensitivity to mismatch between transistors 310 and 311.

Figure 4:
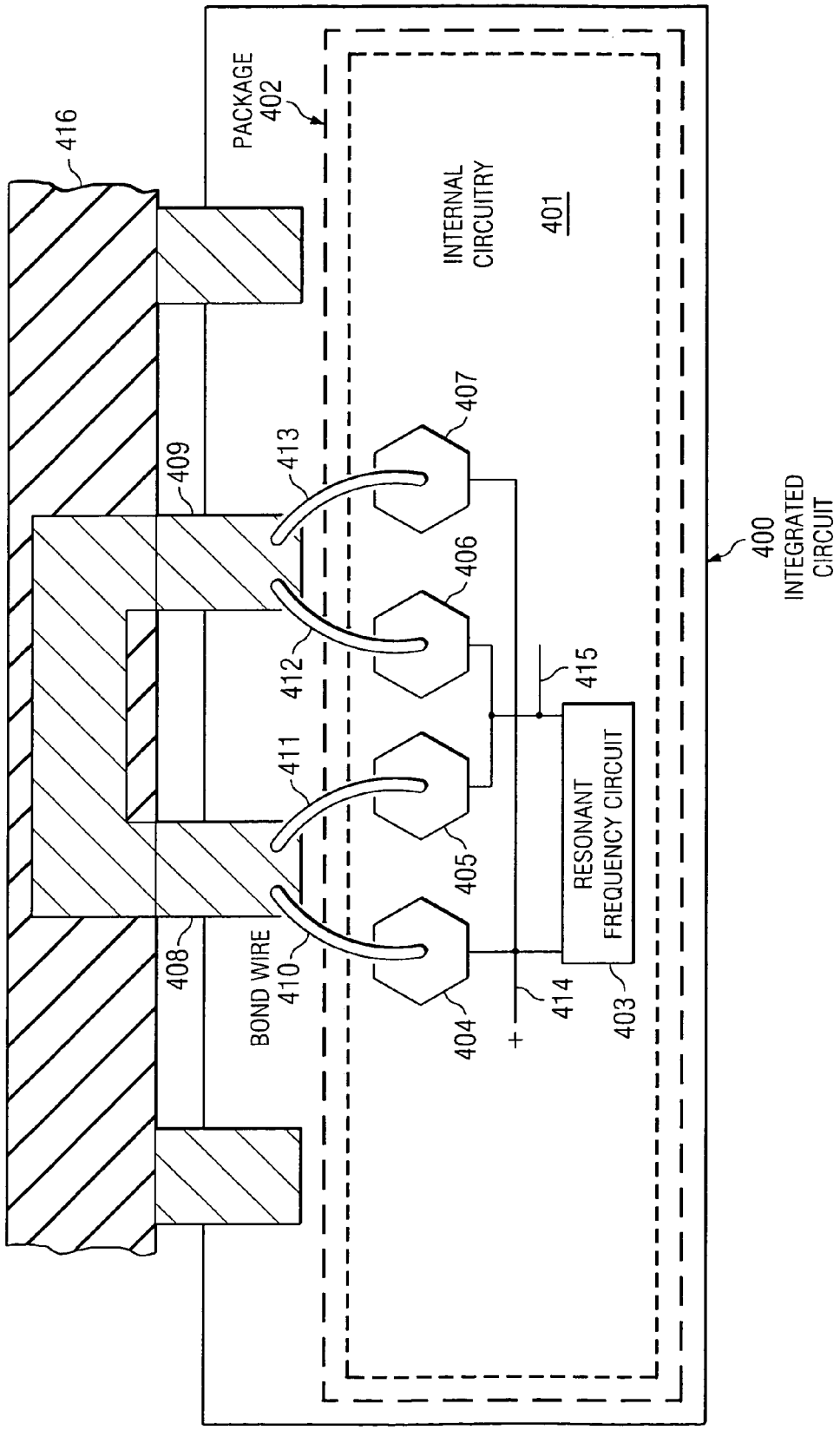
FIG. 4 shows an example implementation of coupling an IC's internal circuitry to the IC's package pins according to an alternative embodiment.

FIG. 4 shows an example implementation of coupling internal circuitry to the IC package pins according to an alternative embodiment. In this example of FIG. 4, two IC package pins are used for coupling with the internal circuit of the IC, as with the example of FIG. 1. Further, as with the example of FIG. 1, two bondwires are coupled to each of the IC package pins, and the bondwires coupled to each IC package pin carry signals of opposite polarities. However, in this example, the bondwires are not arranged such that the polarity of the signals carried alternates with each bondwire (i.e., the polarities are not interleaved across all of the bondwires). That is, the neighboring bondwire(s) of any given bondwire do not carry signals of opposite polarity relative to the polarity of the signal carried by the given bondwire.

In FIG. 4, IC 400 includes an internal circuitry portion 401 (e.g., a die) and a package portion 402. In this example, internal circuitry portion 401 includes resonant frequency circuit 403, such as a VCO and tank, etc. Package 402 includes pins, such as pins 408 and 409, that may be used for coupling the IC to an external component, such as to a printed circuit board (PCB) 416 in the example of FIG. 4. Pins 408 and 409 are electrically coupled together (e.g., on board 416), as shown, and thus provide an electrically common interface. As described further below, in this example, two bondwires are coupled to each of pins 408 and 409, wherein the two bondwires coupled to each pin provide opposite polarities. More specifically, in the example of FIG. 4, bondwires 410 and 411 couple internal pads 404 and 405, respectively, to pin 408. Similarly, bondwires 412 and 413 couple internal pads 406 and 407, respectively, to pin 409. A signal 414 of a first polarity (positive (+) polarity) of resonant frequency circuit 403 is supplied to internal pads 404 and 406, and a signal 415 of an opposite polarity (negative (−) polarity) of resonant frequency circuit 403 is supplied to internal pads 405 and 407. Thus, regarding the two bondwires coupled to pin 408, bondwire 410 carries signal 414 of positive polarity, while bondwire 411 carries signal 415 of negative polarity. Regarding the two bondwires coupled to pin 409, bondwire 412 carries signal 415 of negative polarity, while bondwire 413 carries signal 414 of positive polarity.

While this configuration may result in reduced far-field coupling (which may be desirable in some applications), the mutual inductance between the two middle bondwires (411, 412) is now positive which makes the effective inductance of the inner bondwires (411, 412) larger than in the configuration of FIG. 1. The mutual inductance of the inner pair cancels the contributions of the mutual inductances of the outer pairs leaving almost all of the self inductances of bondwires 411 and 412. The outer pair of bondwires (410, 413) will be reduced by the full mutual inductance. This will usually result in a significant imbalance in the inductance between the positive signal 414 and negative signal 415. This imbalance could result in elevated even harmonics of the fundamental frequency (which are normally suppressed by the differential nature of the oscillator)

Figure 5A:
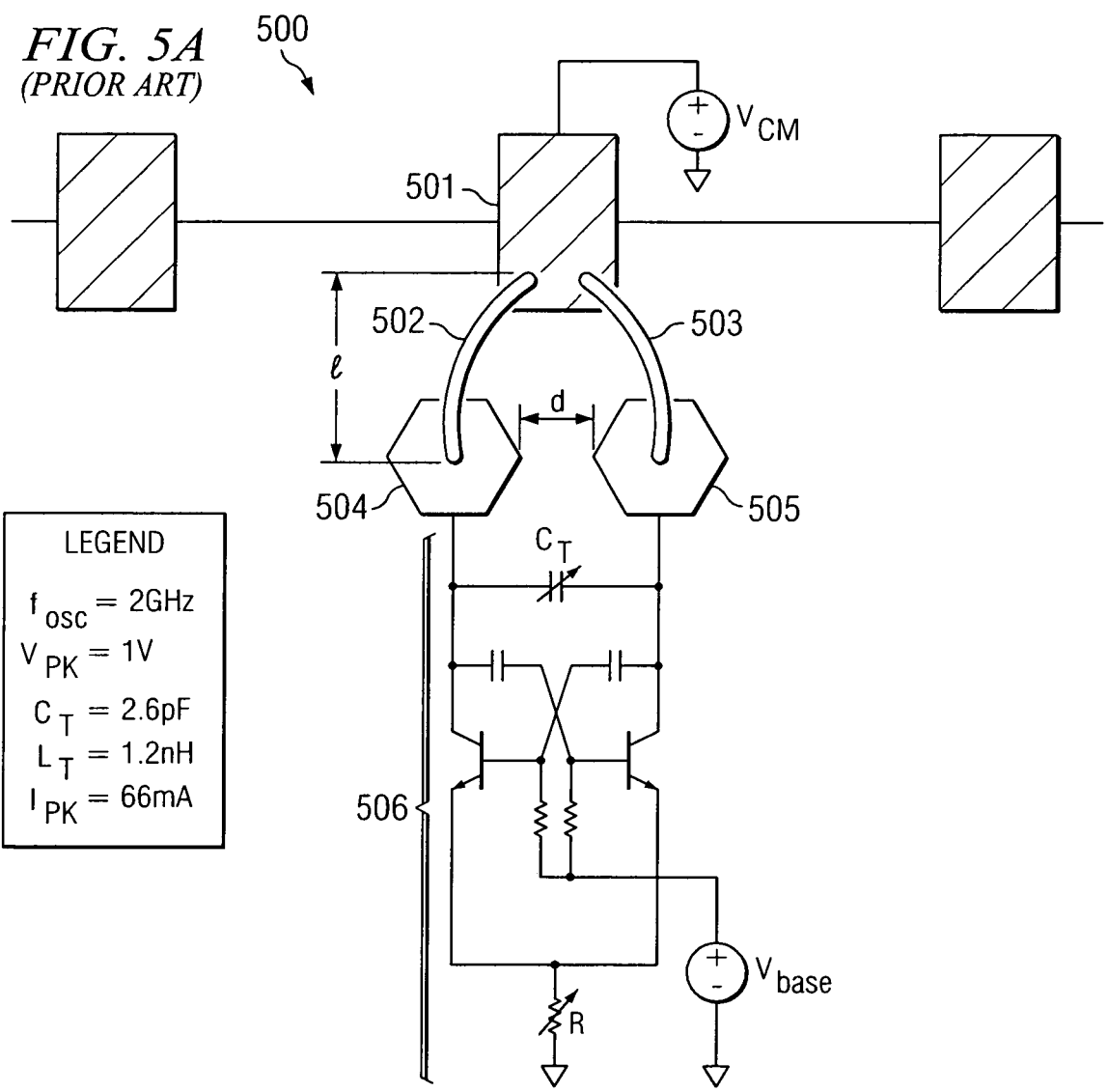
FIG. 5A shows an example of a differential VCO circuit coupled to the IC's package pins according to a traditional coupling technique.
Figure 5B:
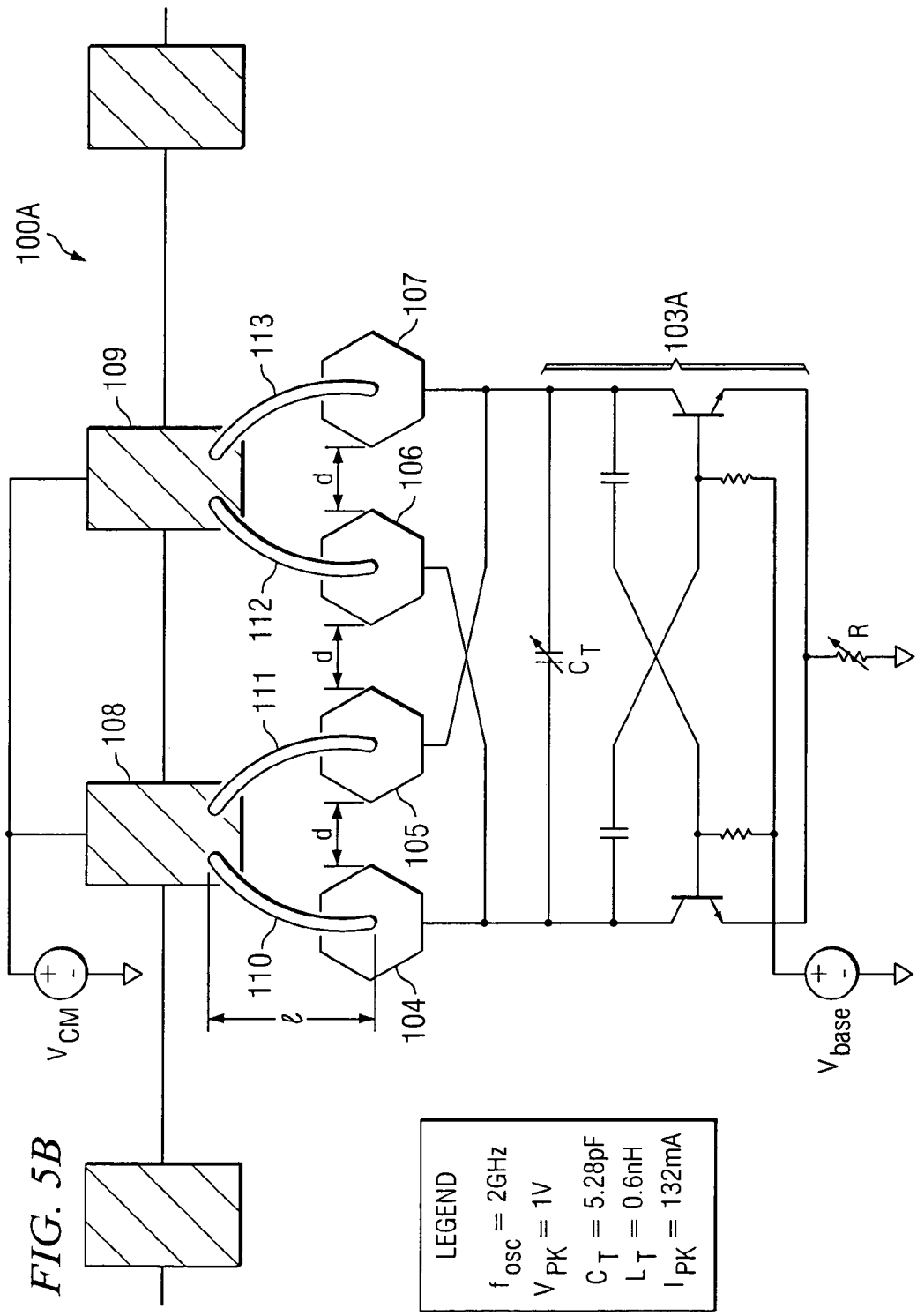
FIG. 5B shows an example of the differential VCO circuit of FIG. 5A coupled to the IC's package pins according to a coupling technique of one embodiment of the present invention.

FIG. 5A shows an example of a differential VCO circuit coupled to the IC's package pins according to a prior coupling technique. FIG. 5B shows an example of the differential VCO circuit of FIG. 5A coupled to the IC's package pins according to a coupling technique of one embodiment of the present invention (i.e., the example coupling technique of FIG. 1). Thus, FIGS. 5A-5B provide a comparison of a prior wirebonding technique used for providing an inductor for a differential VCO circuit with the example technique shown in FIG. 1. In FIGS. 5A-5B, typical values for the length (l) of and distance (d) between the bondwires are 1.5 mm and 0.5 mm, respectively. Increasing the length l of the bondwires increases the self inductance of the bondwires and also increases the mutual inductance between the bondwires. Increasing the distance d between the wires decreases the mutual inductance between the bondwires.

Turning first to FIG. 5A, an example of an IC 500 that comprises internal differential VCO circuitry 506 is shown. As shown, internal differential VCO circuitry 506 is coupled to IC package pin 501. More specifically, die pads 504 and 505 are coupled via bondwires 502 and 503, respectively, to IC package pin 501. Bondwires 502 and 503 are used as inductors for the differential VCO circuit 506.

In the traditional configuration of FIG. 5A, assuming the bondwire inductance (L) is the equivalent of 1.2 nH and an oscillation frequency ($f_{osc}$) of 2 GHz is desired, the required capacitance in the tank would be approximately 2.64 pF. If the peak voltage ($V_{PK}$) across the capacitor were driven to 1 V, the peak current ($I_{PK}$) in the inductor would be 66 mA.

FIG. 5B shows an example in which the internal differential VCO circuitry is coupled to the IC package pins using the technique of FIG. 1. More specifically, FIG. 5B shows an example IC 100A that includes differential VCO circuitry 103A. Thus, differential VCO circuitry 103A provides an example of the resonant frequency circuitry 103 of FIG. 1. As shown, and as further described above with FIG. 1, internal differential VCO circuitry 103A is coupled to IC package pins 108 and 109. More specifically, die pads 104-105 are coupled via bondwires 110 and 111, respectively, to IC package pin 108, and die pads 106-107 are coupled via bondwires 112 and 113, respectively, to IC package pin 109. Bondwires 110-113 are used as inductors for the differential VCO circuit 103A. In the example configuration of FIG. 5B, the bondwire inductance will be approximately 0.6 nH, as opposed to the 1.2 nH of FIG. 5A. Thus, the required capacitance in FIG. 5B would need to be 5.28 pF. Accordingly, if the peak voltage ($V_{PK}$) across the capacitor were the same 1 V (as in FIG. 5A), the peak current ($I_{PK}$) in the inductor would be 132 mA. Thus, as compared to the prior configuration of FIG. 5A, the configuration of FIG. 5B reduces the bondwire inductance, which allows greater power to be supplied to the resonant tank, thus decreasing the phase noise of the differential VCO circuitry.

Figure 6:
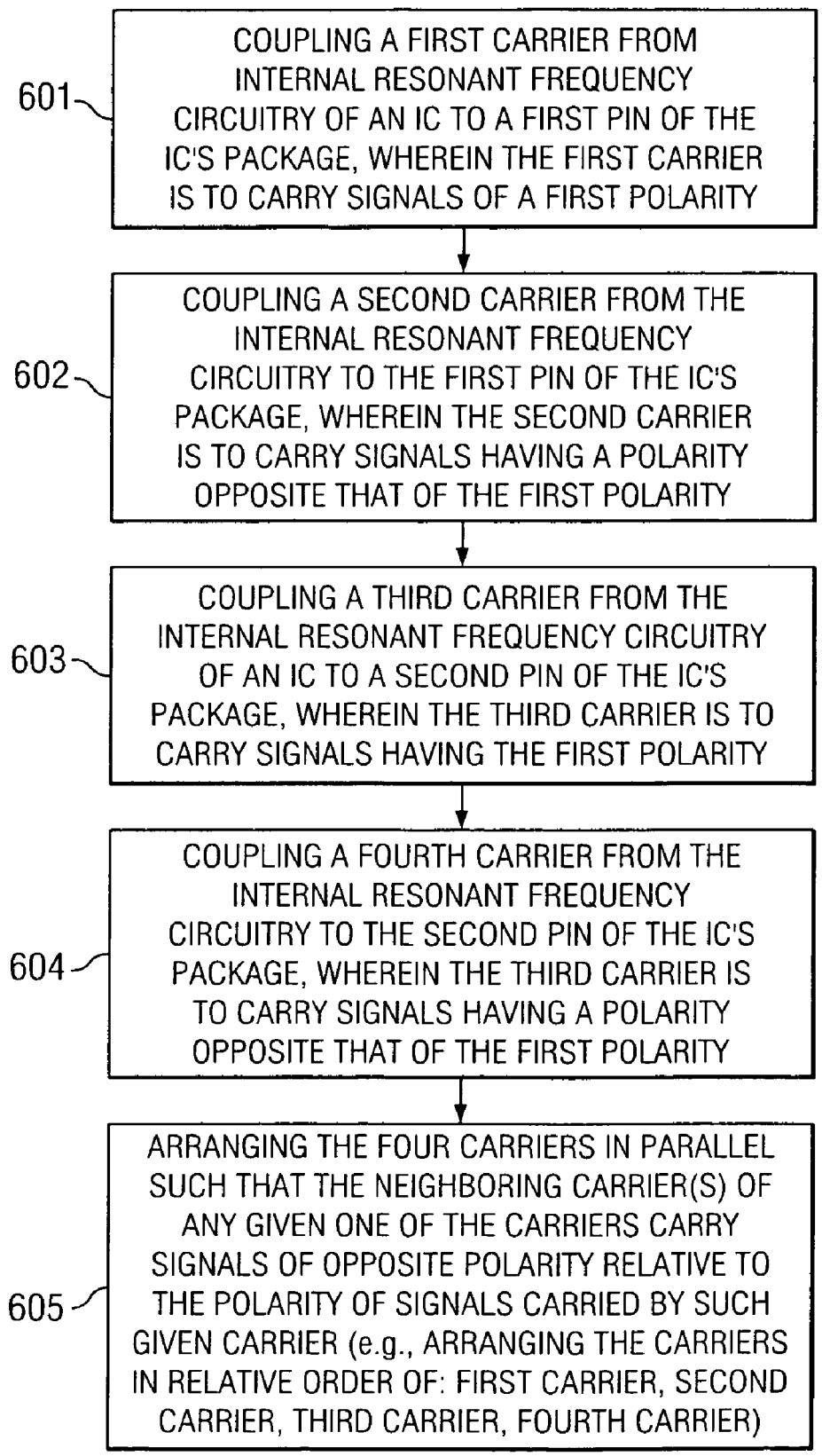
FIG. 6 shows an example flow diagram for coupling an IC's internal circuitry to the IC's package pins in accordance with one embodiment of the present invention.

FIG. 6 shows an example flow diagram for coupling internal circuitry (e.g., resonant frequency circuitry) of an IC to the IC's package pins in accordance with one embodiment of the present invention. In operational block 601, a first carrier (e.g., bondwire) is coupled from the internal resonant frequency circuitry of an IC to a first pin of the IC's package, wherein the first carrier is to carry signals of a first polarity. For instance, in the example embodiment of FIG. 1, a first bondwire 110 is coupled from the internal circuitry 101 to a first pin 108 of IC package 102, wherein bondwire 110 is to carry signals 114 of a first polarity (positive polarity) for resonant frequency circuit 103.

In operational block 602, a second carrier (e.g., bondwire) is coupled from the IC's internal resonant frequency circuitry to the first pin of the IC's package, wherein the second carrier is to carry signals having a polarity opposite that of the first polarity. For instance, in the example embodiment of FIG. 1, a second bondwire 111 is coupled from the internal circuitry 101 to the first pin 108 of IC package 102, wherein bondwire 111 is to carry signals 115 having a polarity (negative polarity) that is opposite the polarity of signal 114 carried by bondwire 110.

In certain implementations, the further optional blocks 603-605 may be performed in achieving a desired coupling of the internal IC circuitry with the IC's package pins. As described further below, blocks 603-605 provide for coupling the internal IC circuitry with additional pins of the IC package, which may be desirable for certain internal resonant frequency circuits, such as a differential VCO. In operational block 603, a third carrier (e.g., bondwire) is coupled from the IC's internal resonant frequency circuitry to a second pin of the IC's package, wherein the third carrier is to carry signals of a first polarity. For instance, in the example embodiment of FIG. 1, a third bondwire 112 is coupled from the internal circuitry 101 to a second pin 109 of IC package 102, wherein bondwire 112 is to carry signals 114 of a first polarity (positive polarity) for resonant frequency circuit 103.

In operational block 604, a fourth carrier (e.g., bondwire) is coupled from the IC's internal resonant frequency circuitry to the second pin of the IC's package, wherein the fourth carrier is to carry signals having a polarity opposite that of the first polarity. For instance, in the example embodiment of FIG. 1, a fourth bondwire 113 is coupled from the internal circuitry 101 to the second pin 109 of IC package 102, wherein bondwire 113 is to carry signals 115 having a polarity (negative polarity) that is opposite the polarity of signal 114 carried by bondwire 112.

In block 605, the four carriers are arranged in the IC such that the neighboring carrier(s) of any given one of the carriers carry signals of opposite polarity relative to the polarity of signals carried by such given carrier. For instance, in the example of FIG. 1, bondwires 110-113 are arranged such that the polarity of signals carried by the bondwires alternates between every other one of the bondwires. That is, bondwires 110-113 are arranged in parallel, wherein, starting with first bondwire 110, every other one of the bondwires (bondwire 112) carries signal 114 of positive polarity, and, starting with second bondwire 111, every other one of the bondwires (bondwire 113) carries signal 115 of negative polarity. As described above, this arrangement minimizes the inductance of the bondwires.

It should be recognized that while the flow of FIG. 6 refers to an IC's internal resonant frequency circuitry, it may be applied to any type of internal circuitry, particularly circuitry that uses the coupling (bondwires) as inductors.

While various embodiments are described above for coupling an IC's internal resonant frequency circuit to the IC's package pins, such embodiments are particularly applicable for circuitry that uses the coupling mechanisms (e.g., bondwires) as inductors in a resonant tank, such as is commonly used in filters or oscillators. Ideally, in such implementations, there should be no signal transmitted off of the IC through the relevant coupling mechanisms (e.g., bondwires) that are used as inductors. As described above, the coupling techniques of embodiments of the present invention enable the effective inductance of such coupling mechanisms (e.g., bondwires) to be reduced, thereby allowing for a reduction in noise to be achieved.

Although the present invention and its advantages have been described in detail, it should be understood that various changes, substitutions and alterations can be made herein without departing from the invention as defined by the appended claims. Moreover, the scope of the present application is not intended to be limited to the particular embodiments of the process, machine, manufacture, composition of matter, means, methods and steps described in the specification. As one will readily appreciate from the disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An integrated circuit comprising:
   internal circuitry;
   package having at least two pins;
   a first carrier communicatively coupling said internal circuitry with a first one of said at least two pins, wherein said first carrier carries a signal of a first polarity;
   a second carrier communicatively coupling said internal circuitry with said first one of said at least two pins, wherein said second carrier carries a signal of a polarity opposite said first polarity;
   a third carrier communicatively coupling said internal circuitry with a second one of said at least two pins, wherein said third carrier carries a signal of said first polarity; and
   a fourth carrier communicatively coupling said internal circuitry with said second one of said at least two pins, wherein said fourth carrier carries a signal of a polarity opposite said first polarity.

2. The integrated circuit of claim 1 wherein said package encloses said circuitry therein.

3. The integrated circuit of claim 1 wherein said at least two pins provides an interface for said internal circuitry to a component external to said integrated circuit.

4. The integrated circuit of claim 1 wherein said first, second, third, and fourth carriers are bond wires.

5. The integrated circuit of claim 1 wherein said internal circuitry comprises resonant frequency circuitry.

6. The integrated circuit of claim 5 wherein said resonant frequency circuitry comprises a voltage controlled oscillator.

7. The integrated circuit of claim 6 wherein said voltage controlled oscillator is a differential voltage controlled oscillator.

8. The integrated circuit of claim 5 wherein said resonant frequency circuitry comprises at least one selected from the group consisting of: oscillator, resonant tank, filter, and matching circuit.

9. The integrated circuit of claim 1 wherein said resonant frequency circuitry comprises a resonant tank.

10. The integrated circuit of claim 9 wherein said resonant tank uses said first, second, third, and fourth carriers as inductors.

11. The integrated circuit of claim 1 wherein said internal circuitry uses said first, second, third, and fourth carriers as inductors.

12. The integrated circuit of claim 1 wherein said first one and said second one of said at least two pins are electrically coupled together to form a common electrical node.

13. The integrated circuit of claim 12 wherein said first one and said second one of said at least two pins are electrically coupled together external to said integrated circuit.

14. The integrated circuit of claim 12 wherein said first one and said second one of said at least two pins are electrically coupled together within said package of said integrated circuit.

15. The integrated circuit of claim 1 wherein said first, second, third, and fourth carriers are arranged in parallel interleaving the signal polarities carried thereby.

16. The integrated circuit of claim 1 wherein the carriers are arranged with said first carrier arranged as a neighbor to said second carrier, said second carrier arranged as a neighbor to said third carrier, and said third carrier arranged as a neighbor to said fourth carrier.

17. The integrated circuit of claim 1 wherein said first one and said second one of said pins are neighbor pins in said package.

18. A method comprising:
    coupling a first carrier from an internal resonant frequency circuitry of an integrated circuit to an electrically common interface of the integrated circuit's package, wherein said first carrier is arranged to carry signals of a first polarity;
    coupling a second carrier from said internal resonant frequency circuitry of said integrated circuit to said electrically common interface of the integrated circuit's package, wherein said second carrier is arranged to carry signals of a polarity opposite said first polarity; and
    coupling a third carrier from said internal resonant frequency circuitry of said integrated circuit to said electrically common interface of the integrated circuit's package, wherein said third carrier is arranged to carry signals of said first polarity.

19. The method of claim 18 wherein said coupling said first carrier from said internal resonant frequency circuitry to said electrically common interface comprises bonding a first wire from said internal resonant frequency circuitry to said electrically common interface, wherein said coupling said second carrier from said internal resonant frequency circuitry to said electrically common interface comprises bonding a second wire from said internal resonant frequency circuitry to said electrically common interface, and wherein said coupling said third carrier from said internal resonant frequency circuitry to said electrically common interface comprises bonding a third wire from said internal resonant frequency circuitry to said electrically common interface.

20. The method of claim 18 wherein said electrically common interface comprises at least one pin.

21. The method of claim 20 wherein said electrically common interface comprises a plurality of pins that are electrically coupled together.

22. The method of claim 18 wherein said electrically common interface comprises a plurality of pins, further comprising:
    electrically coupling said plurality of pins together external to said integrated circuit.

23. The method of claim 18 further comprising:
    coupling a fourth carrier from said internal resonant frequency circuitry of said integrated circuit to said electrically common interface of the integrated circuit's package, wherein said fourth carrier is arranged to carry signals of a polarity opposite said first polarity.

24. The method of claim 23 wherein said electrically common interface comprises two pins that are electrically coupled together, said coupling said first, second, third, and fourth carriers from said internal resonant frequency circuitry to said electrically common interface comprises:
    coupling said first and second carriers to a first one of said two pins; and
    coupling said third and fourth carriers to second one of said two pins.

25. The method of claim 24 further comprising:
arranging said first, second, third, and fourth carriers to interleave the signal polarities carried thereby.

26. The method of claim 24 further comprising:
arranging said first, second, third, and fourth carriers such that the neighboring carriers of any given one of said first, second, third, and fourth carriers carry signals of opposite polarity relative to the polarity of signals carriers by said given one.

27. The method of claim 18 further comprising:
using said first, second, and third carriers as inductors for said internal resonant frequency circuitry.

28. The method of claim 18 further comprising:
arranging said first, second, and third carriers to interleave the signal polarities carried thereby.

29. The method of claim 18 wherein said internal resonant frequency circuitry comprises at least one selected from the group consisting of: oscillator, resonant tank, filter, and matching circuit.

30. The method of claim 18 wherein said internal resonant frequency circuitry comprises a resonant tank.

31. A system comprising:
resonant tank circuitry implemented in a package that provides a plurality of interface means that are electrically coupled together to form an electrically common interface;
first coupling means for communicatively coupling said resonant tank circuitry to one of said plurality of interface means, wherein said first coupling means carries a signal of a first polarity; and
second coupling means for communicatively coupling said resonant tank circuitry to one of said plurality of interface means, wherein said second coupling means carries a signal of polarity opposite said first polarity.

32. The system of claim 31 wherein said first coupling means and said second coupling means are used as inductors for said resonant tank circuitry.

33. The system of claim 31 further comprising:
third coupling means for communicatively coupling said resonant tank circuitry to one of said plurality of interface means, wherein said third coupling means carries a signal of said first polarity.

34. The system of claim 33 further comprising:
fourth coupling means for communicatively coupling said resonant tank circuitry to one of said plurality of interface means, wherein said fourth coupling means carries a signal of polarity opposite said first polarity.

35. The system of claim 34 wherein said first and second coupling means couple said resonant tank circuitry to a first one of said plurality of interface means, and wherein said third and fourth coupling means couple said resonant tank circuitry to a second one of said plurality of interface means.

36. The system of claim 31 wherein said plurality of interface means are electrically coupled together external to said package.

37. The system of claim 31 further comprising a board to which said package is electrically coupled, wherein said plurality of interface means are electrically coupled together on said board.

38. A system comprising:
internal circuitry implemented in a package that provides a plurality of pins;
a first plurality of carriers communicatively coupling said internal circuitry to a first one of said plurality of pins, wherein said first plurality of carriers are used as inductors for said internal circuitry, and wherein at least one of said first plurality of carriers carries a signal of a first polarity and at least one other of said first plurality of carriers carries a signal of polarity opposite said first polarity;
a second plurality of carriers communicatively coupling said internal circuitry to a neighboring pin of said first one of said plurality of pins, wherein said second plurality of carriers are used as inductors for said internal circuitry, and wherein at least one of said second plurality of carriers carries a signal of said first polarity and at least one other of said second plurality of carriers carries a signal of polarity opposite said first polarity; and
said first plurality of carriers and said second plurality of carriers arranged to interleave the polarities of signals carried thereby.

39. The system of claim 38 wherein said plurality of pins each provide an interface for communicatively coupling to a component external to the package.

40. The system of claim 39 wherein the external component electrically couples said first pin and said neighboring pin together.

41. The system of claim 28 wherein said internal circuitry comprises resonant tank circuitry.

42. The system of claim 41 wherein said resonant tank circuitry uses said first plurality of carriers and said second plurality of carriers as inductors.

43. The system of claim 38 wherein said first one pin and said neighboring pin are electrically coupled together to form a common electrical node.

* * * * *